(12) United States Patent
Phillips et al.

(10) Patent No.: US 9,304,385 B2
(45) Date of Patent: Apr. 5, 2016

(54) EXPOSURE METHOD AND DEVICE MANUFACTURING METHOD INCLUDING SELECTIVE DEFORMATION OF A MASK

(75) Inventors: Alton H. Phillips, East Palo Alto, CA (US); Douglas C. Watson, Campbell, CA (US); Hiromitsu Yoshimoto, Saitama (JP); Yusaku Uehara, Ageo (JP)

(73) Assignee: Nikon Corporation (JP)

( * ) Notice: Subject to any disclaimer, the term of this patent is extended or adjusted under 35 U.S.C. 154(b) by 1157 days.

(21) Appl. No.: 12/560,760

(22) Filed: Sep. 16, 2009

(65) Prior Publication Data

US 2010/0097588 A1 Apr. 22, 2010

Related U.S. Application Data

(60) Provisional application No. 61/097,484, filed on Sep. 16, 2008, provisional application No. 61/114,073, filed on Jan. 12, 2009.

(51) Int. Cl.
*G03B 27/32* (2006.01)
*G03F 1/00* (2012.01)
*G03F 7/20* (2006.01)

(52) U.S. Cl.
CPC ............... *G03B 27/32* (2013.01); *G03F 1/144* (2013.01); *G03F 7/70783* (2013.01); *G03F 7/70875* (2013.01)

(58) Field of Classification Search
CPC .. G03F 7/70875; G03F 7/70783; G03F 1/144
USPC .......................... 355/75, 72–74, 76, 53; 430/5
See application file for complete search history.

(56) References Cited

U.S. PATENT DOCUMENTS

| 6,611,316 | B2 | 8/2003 | Sewell |
| 7,359,029 | B2 | 4/2008 | Finders |
| 2005/0248744 | A1 | 11/2005 | Shibazaki |
| 2007/0184361 | A1* | 8/2007 | Misaka ............................. 430/5 |
| 2007/0273851 | A1* | 11/2007 | Finders et al. .................. 355/30 |

* cited by examiner

*Primary Examiner* — Chia-How Michael Liu
(74) *Attorney, Agent, or Firm* — Roeder & Broder LLP; Steven G. Roeder

(57) ABSTRACT

An exposure method that uses a substrate (M) held by a holding member (28) to perform exposure processing, comprising a holding process, which holds a prescribed region (AR3) of the substrate as the holding region by means of the holding member, and a deformation process, which selectively deforms one side of the holding region of the substrate held by the holding process with respect to the other side. According to the present invention, a prescribed region of the substrate is held as a holding region by means of a holding member, and one side of the holding region of said held substrate is selectively deformed with respect to the other side, so it is possible to selectively eliminate the nonlinear deformation components attributable to holding of the substrate with respect to one side from among the two sides of the substrate using the holding region as a reference. Since it is possible to put the pattern projected via the substrate into a linearly correctable status, it is possible to reduce warping of the pattern.

20 Claims, 9 Drawing Sheets

EXPOSURE METHOD AND DEVICE MANUFACTURING METHOD INCLUDING SELECTIVE DEFORMATION OF A MASK

RELATED INVENTIONS

This application claims priority on U.S. Provisional Application Ser. No. 61/097,484, filed Sep. 16, 2008 and entitled "EXPOSURE METHOD, DEVICE MANUFACTURING METHOD, AND MASK" and U.S. Provisional Application Ser. No. 61/144,073, filed Jan. 12, 2009 and entitled "EXPOSURE METHOD, DEVICE MANUFACTURING METHOD, AND MASK". As far as permitted, the contents of U.S. Provisional Application Ser. No. 61/097,484 is incorporated herein by reference.

TECHNICAL FIELD

The present invention relates to an exposure method, a device manufacturing method and a mask.

BACKGROUND

Exposure apparatuses used in the photolithography process illuminate the center part of a mask using exposure light and expose a work piece using exposure light that has passed through said mask. Masks used in exposure are held on a mask stage of an exposure apparatus. A known technique in holding the mask using the mask stage is, for example, holding the mask on the mask stage on top of a holding member.

As the number of irradiations of exposure light increases, the temperature of the mask that receives irradiation of exposure light increases, and the mask deforms due to thermal expansion, and distortion can occur. When deformation of the shape of the mask occurs, the pattern projected onto the work piece via said mask unfortunately is deformed. In the case in which the mask deforms due to thermal expansion, many linear components are included in the deformation components, so, for example, by performing linear corrections such as varying the magnification of the projection optical system with respect to the pattern projected via said mask, it is possible to correct for the deformation of said mask.

However, in the case in which the mask is held by a holding member, deformation of the mask is partially restricted by said holding member, and a status in which many nonlinear components are included in the mask deformation components occurs. Even if linear correction such as varying the magnification of the projection optical system, for example, were performed with respect to a pattern projected via a mask that contains many nonlinear components and has deformed, reducing deformation of said pattern would be problematic. When the pattern is unfortunately projected onto the work piece in a deformed status, there is a possibility of exposure defects being generated.

Taking circumstances such as the above into account, the purpose of the present invention is to provide an exposure method, a device manufacturing method and a mask that are able to restrict exposure defects.

SUMMARY

In order to solve the above problems, the exposure method relating to the present invention is an exposure method that uses a substrate (M) (sometimes referred to as a mask) held by a holding member to perform exposure processing, comprising a holding process, which holds a prescribed region (AR3) of the substrate as the holding region by means of the holding member, and a deformation process, which selectively deforms one side of the holding region of the substrate held by the holding process with respect to the other side.

According to the present invention, a prescribed region of the substrate is held as a holding region by means of a holding member, and one side of the holding region of said held substrate is selectively deformed with respect to the other side, so it is possible to selectively reduce and minimize the nonlinear deformation components attributable to holding of the substrate with respect to one side from among the two sides of the substrate using the holding region as a reference. Since it is possible to put the pattern projected via the substrate into a more linearly correctable status, it is possible to reduce the influence of the distortion of the pattern.

The manufacturing method relating to the present invention is a device manufacturing method that has a lithography process, and the lithography process includes the above exposure method.

According to the present invention, it is possible to put the pattern projected via the substrate (M) into a linearly correctable status, and it is possible to reduce distortion of the pattern, so it is possible to obtain a high performance device.

The mask (M) relating to the present invention is a mask used in exposure processing; wherein it has a prescribed region (AR1), in which a prescribed pattern (Mp) is formed and to which exposure light is irradiated at the time of exposure processing, and an outer circumference region (AR2) of the periphery of the prescribed region, the outer circumference region has a holding region (AR3), which is held at the time of exposure processing, and an absorbing region (AR4), which is provided at the outer circumference side of the holding region and has a higher light absorption ratio of the exposure light than other portions of the outer circumference region. Alternatively, in certain embodiments, the positioning of the holding region (AR3) and the absorbing region (AR4) can be switched.

According to the present invention, there is a prescribed region, in which a prescribed pattern is formed and to which exposure light is irradiated at the time of exposure processing, and an outer circumference region of the periphery of the prescribed region, and the outer circumference region has a holding region, which is held at the time of exposure processing, and an absorbing region, which is provided at the outer circumference side of the holding region and has a higher exposure light absorption ratio than other portions of the outer circumference region, so, in the absorbing region, exposure light thermal expansion becomes larger than in other portions. For this reason, it is possible to actively thermally expand the outer circumference side of the holding region, and it is possible to negate at least some of the nonlinear pattern distortion components by means of said thermal expansion.

According to the present invention, it is possible to restrict exposure defects.

DESCRIPTION

Hereunder, embodiments of the present invention will be described while referring to drawings, but the present invention is not limited to these. In the description below, an XYZ rectangular coordinate system will be set up, and the positional relationships of the respective members will be described while referring to this XYZ rectangular coordinate system. A prescribed direction within the horizontal plane will be considered the X axis direction, a direction orthogonal to the X axis direction within the horizontal plane will be considered the Y axis direction, and a direction (specifically, the vertical direction) orthogonal to the X axis direction and the Y axis direction respectively will be considered the Z axis direction. In addition, the directions of rotation (inclination) about the X axis, Y axis and Z directions shall respectively be considered the θX, θY and θZ directions.

Figure 1:
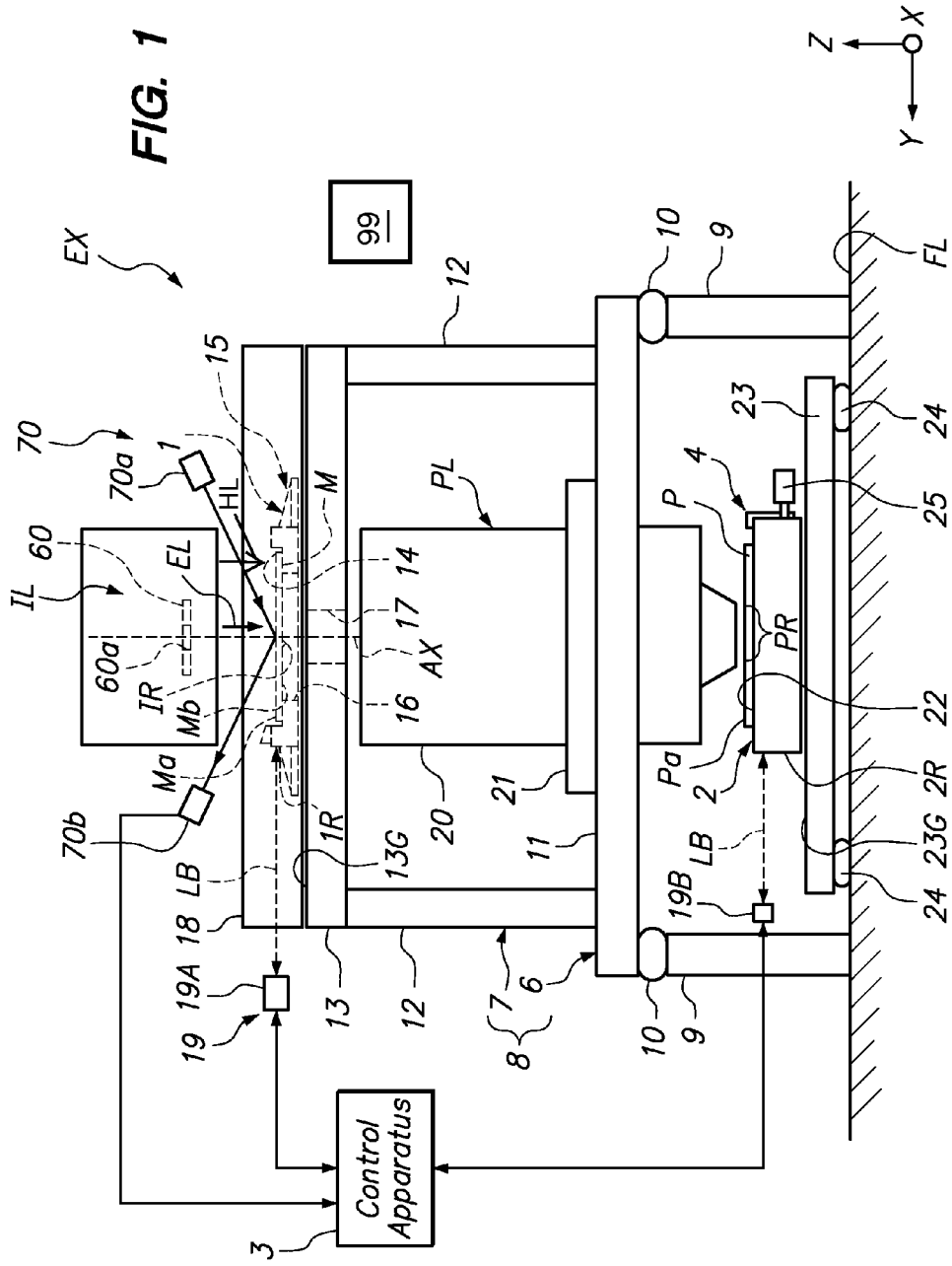
FIG. 1 is a schematic block diagram that shows an example of an exposure apparatus relating to the first embodiment of the present invention.

FIG. 1 is a schematic block diagram that shows an example of an exposure apparatus EX relating to the first embodiment. In FIG. 1, the exposure apparatus EX comprises a mask stage 1, which holds a mask M and is able to move, a work piece stage 2, which holds a work piece P and is able to move, an illumination system IL, which illuminates the mask M held by the mask stage 1 using exposure light, a projection optical system PL, which projects an image of the pattern of the mask M illuminated by the exposure light EL to the work piece P held by the work piece stage 2, a control apparatus 3, which controls the operations of the entire exposure apparatus EX, and a measurement stage 4, which performs measurement, etc. The control apparatus 3 includes, for example, a computer system. It should be noted that the illumination system IL can further provide a heat light HL, which is usable to selectively radiate different regions of the mask M.

The exposure apparatus EX of the present embodiment is a scanning type exposure apparatus (a so-called scanning stepper), which synchronously moves the mask M and the work piece P in a prescribed scanning direction while exposing the work piece P using the exposure light EL that has come via the mask M. In the present embodiment, the scanning direction (synchronous movement direction) of the work piece P is considered the Y axis direction, and the scanning direction (synchronous movement direction) of the mask M is also considered the Y axis direction. The exposure apparatus EX moves the work piece P in the Y axis direction with respect to the projection region PR of the projection optical system PL while moving the mask M in the Y axis direction with respect to the illumination region IR of the illumination system IL synchronously with movement of that work piece P in the Y axis direction while illuminating the mask M using the exposure light EL and irradiates the exposure light EL from that mask M to the work piece P via the projection optical system PL. The illumination region IR of the illumination system IL includes the irradiation position of the exposure light EL irradiated from the illumination system IL, and the projection region PR of the projection optical system PL includes the irradiation position of the exposure light EL irradiated from the projection optical system PL.

The exposure apparatus EX comprises a body 8, which includes a first column 6 provided on the floor FL inside a clean room, for example, and a second column 7 provided on the first column 6. The first column 6 comprises a plurality of first support posts 9 and a first plate 11 supported on these first support posts 9 via vibration isolation apparatuses 10. The second column 7 comprises a plurality of second support posts 12 provided on the first plate 11 and a second plate 13 supported on these second support posts 12. The second plate 13 has a second opening 17 that the exposure light EL passes through.

The illumination system IL illuminates the prescribed illumination region IR using exposure light EL with a uniform illumination intensity distribution. The illumination system IL illuminates at least a part of the mask M arranged in the illumination region IR using exposure light EL of a uniform illumination intensity distribution. The illumination system IL has a reticle blind 60 provided with, for example, a rectangular opening part 60a. Said reticle blind 60 is arranged on the optical path of the exposure light within the illumination system IL. The exposure light that has passed through the opening part 60a of the reticle blind 60 from among the exposure light emitted from the light source is irradiated to the illumination region IR. In the present embodiment, the dimensions of the opening part 60a part are changeable. By changing the dimensions of said opening part 60a, it becomes possible for the dimensions of the illumination region IR to change. Used as the exposure light EL that emerges from the illumination system IL is, for example, deep ultraviolet light (DUV light) such as bright lines (g lines, h lines, i lines) that emerge from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser light, which is ultraviolet light (vacuum ultraviolet light), is used as the exposure light EL.

The mask stage 1 is supported without contact by the upper surface (guide surface) 13G of the second plate 13 by means of gas bearings. The mask stage 1 is able to move in three directions, which are the X axis, Y axis and θZ directions, along the upper surface 13G of the second plate 13, which includes the irradiation position (illumination region IR of the illumination system IL) of the exposure light EL that emerges from the illumination system IL by means of actuation of a mask stage drive apparatus 15 that includes an actuator such as a linear motor. The mask stage 1 has a first opening 16 through which the exposure light EL passes at, for example, the time of exposure of the substrate or at the time of measurement using the exposure light EL.

The mask stage 1 has a mask holding part 14, which holds the mask M to which the exposure light EL is irradiated. The mask holding part 14 is able to attach and remove the mask M. In the present embodiment, the mask holding part 14 holds the mask M so that the lower surface (pattern forming surface) Mb and the XY plane of the mask M become nearly parallel.

A counter mass 18, which moves in a direction (for example, the −Y direction) opposite that of the mask stage 1 according to the movement of that mask stage 1 in one of the directions (for example, the +Y direction) of the Y axis directions, is provided on the second plate 13. The counter mass 18 is supported without contact on the upper surface 13G of the second plate 13 by means of a dead weight canceling mechanism that includes air pads. In the present invention, the counter mass 18 is supported at the periphery of the mask stage 1.

Position information of the mask stage 1 (mask M) is measured by means of a laser interferometer 19A of an interferometer system 19. The laser interferometer 19A irradiates measurement light LB to the reflecting surface 1R of the mask stage 1. The laser interferometer 19A uses the measurement light LB irradiated to the reflecting surface 1R of the mask stage 1 to measure position information of the mask stage 1 relating to the X axis, Y axis and θZ directions. The control apparatus 3 actuates a mask stage drive apparatus 15 based on the measurement results of the interferometer system 19 (laser interferometer 19A) and performs position control of the mask M held by the mask stage 1.

The projection optical system PL irradiates the exposure light EL to a prescribed projection region PR. The work piece P is able to move to the projection region PR (the irradiation position of the exposure light EL) of the projection optical system PL. The projection optical system PL projects the image of the pattern of the mask M to at least a part of the work piece P arranged in the projection region PR at a prescribed projection magnification. The plurality of optical elements of the projection optical system PL is held by the lens barrel 20. The lens barrel 20 has a flange 21. The flange 21 is supported by the first plate 11. The projection optical system PL of the present embodiment is a reduction system in which the projection magnification is ¼, ⅕ or ⅛, for example. Note that the projection optical system PL may be either a reduction system or an enlargement system. In the present embodiment, the optical axis AX of the projection optical system PL is parallel to the Z axis. Furthermore, the projection optical system PL may also be any of a dioptric system that does not include a reflecting optical element, a catoptric system that does not include a refracting optical element, or a catadioptric system that includes both a reflecting optical element and a refracting optical element. In addition, the projection optical system PL may form either an inverted image or an erect image.

The work piece stage 2 has a work piece holding part 22 that holds the work piece P to which the exposure light EL is irradiated. The work piece holding part 22 is able to attach and remove the work piece P. In the present embodiment, the work piece holding part 22 holds the work piece P so that the exposure surface (upper surface) Pa of the work piece P and the XY plane become nearly parallel. The work piece stage 2 is supported without contact by the upper surface (guide surface) 23G of the third plate 23 by means of gas bearings. In the present embodiment, the upper surface 23G of the third plate 23 and the XY plane are nearly parallel. The third plate 23 is supported via vibration isolation apparatuses 24 on the floor FL. The work piece stage 2 is able to hold the work piece P and move along the upper surface 23G of the third plate 23 including the irradiation position (the projection region PR of the projection optical system PL) of the exposure light EL that emerges from the projection optical system PL by means of actuation of a work piece stage drive apparatus 25 that includes an actuator such as a linear motor. In the present embodiment, the work piece stage 2 is able to move in six directions, which are the X axis, Y axis, Z axis, θX, θY and θZ directions on the third plate 23 in a status in which the work piece P is held by the work piece holding part 22.

Position information of the work piece stage 2 (work piece P) is measured by means of a laser interferometer 19B of an interferometer system 19. The laser interferometer 19B irradiates measurement light LB to the reflecting surface 2R of the work piece stage 2. The laser interferometer 19B uses the measurement light LB irradiated to the reflecting surface 2R of the work piece stage 2 to measure position information of the work piece stage 2 relating to the X axis, Y axis and θZ directions. In addition, surface position information (position information relating to the Z axis, θX and θY directions) of the exposure surface Pa of the work piece P held by the work piece stage 2 is detected by a focus leveling detection system that is not shown. The control apparatus 3 actuates the work piece stage drive apparatus 25 based on the measurement results of the interferometer system 19 (laser interferometer 19B) and the detection results of the focus leveling detection system and performs position control the work piece P held by the work piece stage 2.

A measurement stage 4 is arranged at a position that is superposed with the work piece stage 2 in the X direction in FIG. 1 and, similarly to the work piece stage 2, is provided be in able to move in six directions, which are the X axis, Y axis, Z axis, θX, θY and θZ directions. A measuring apparatus that is not shown, which performs various measurements such as alignment of the mask M and adjustment of projection optical system PL, is built into the measurement stage 4.

Figure 2:
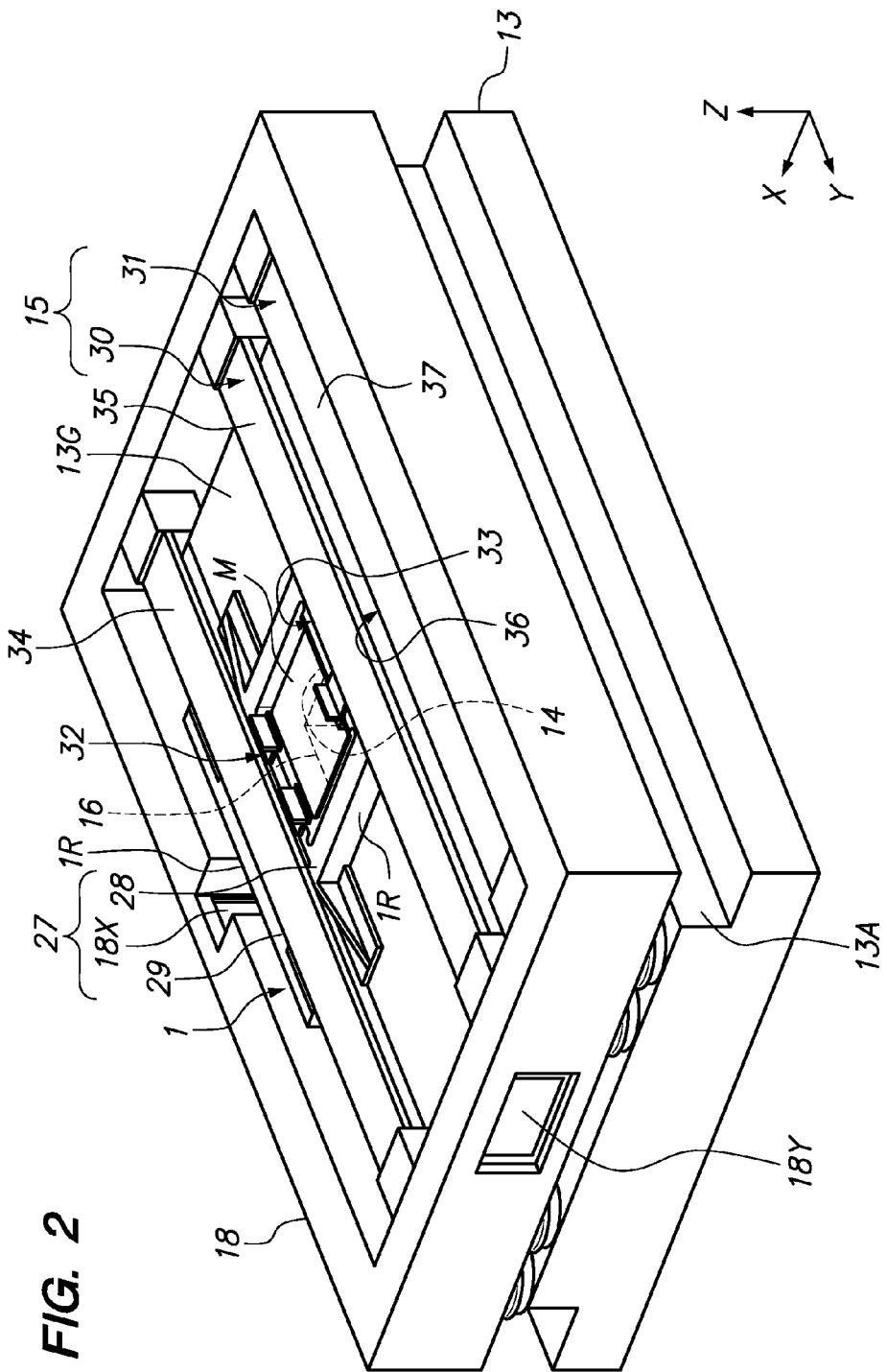
FIG. 2 is an oblique view that shows the vicinity of the mask stage relating to the present embodiment.
Figure 3:
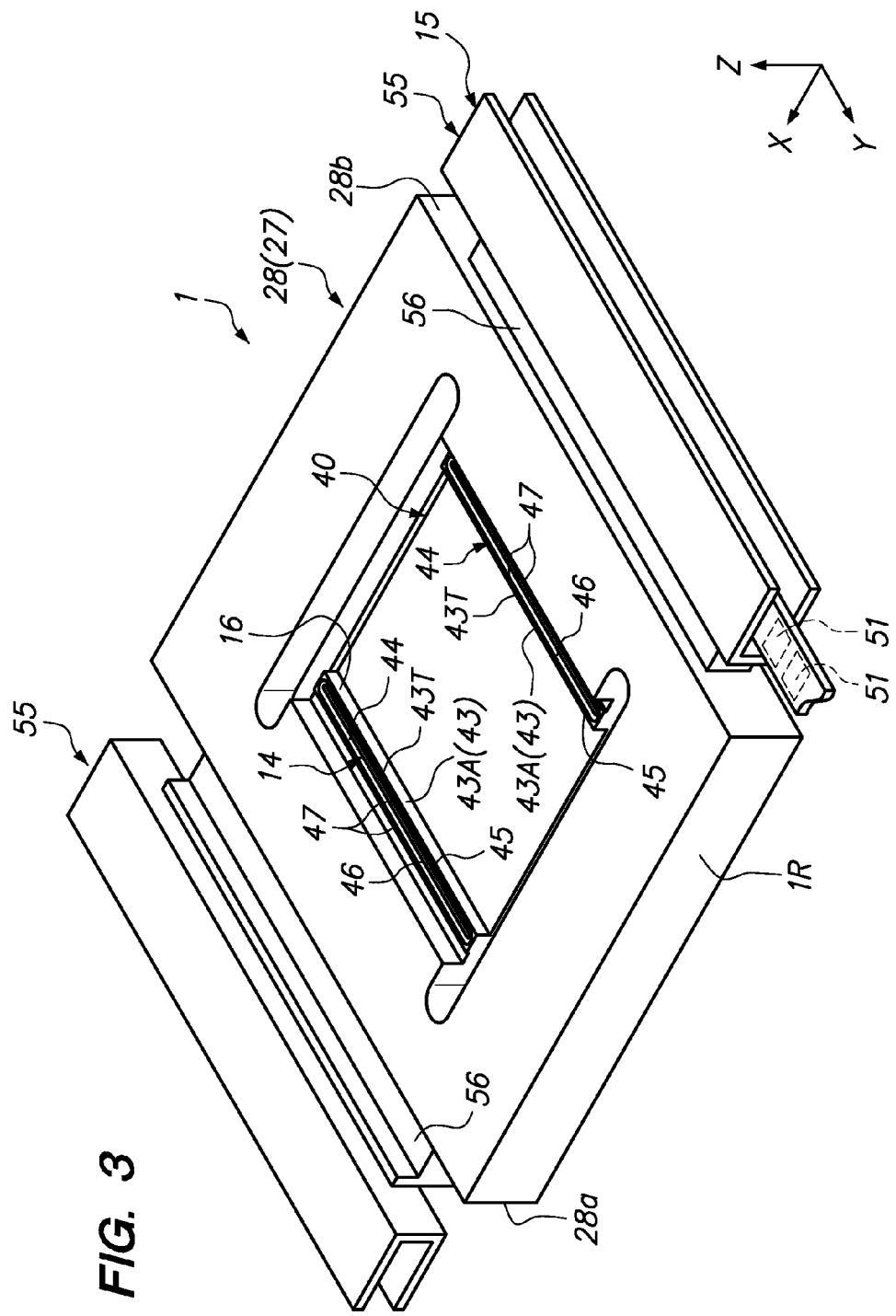
FIG. 3 is an oblique view that shows an enlargement of a part of the mask stage relating to the present embodiment.

FIG. 2 is an oblique view of the vicinity of the mask stage 1, the counter mass 18 and the second plate 13 relating to the present embodiment. FIG. 3 is an oblique view that shows the configuration of a part of the mask stage 1. In FIG. 2 and FIG. 3, the mask stage 1 comprises a mask stage main body 27 provided with the mask holding part 14.

As shown in FIG. 2, the mask stage main body 27 has a nearly rectangular first member 28 within the XY plane and a second member 29 that is long in the Y axis direction and is connected to the +X side and of the first member 28. The first member 28 has, at the +Y side surface, a reflecting surface 1R to which the measurement light LB of the laser interferometer 19A is irradiated. The reflecting surface 1R of the first member 28 is nearly perpendicular with the Y axis. A transmission region 18Y through which the measurement light LB of the laser interferometer 19A is able to pass is arranged at the +Y side surface of the counter mass 18. The laser interferometer 19A is able to irradiate the measurement light LB to the reflecting surface 1R of the first member 28 via the transmission region 18Y.

A protruding part 13A is provided at nearly the center of the second plate 13. The guide surface 13G of the second plate 13 includes the upper surface of the protruding part 13A. A vacuum pressure type air pad 57 is provided at a surface that opposes the guide surface 13G of the first member 28. This air pad 57 is such that the first member 28 is supported in a floating manner (noncontact support) with respect to the guide surface 13G via a clearance of, for example, approximately several microns, by means of air being blown toward the guide surface 13G. In addition, this air pad 57 is able to maintain said clearance by the air between the first member 28 and the guide surface 13G being suctioned. The mask stage main body 27 is such that it is supported without contact at the upper surface 13G of the protruding part 13A by means of said air pad 57. The second opening 17 is provided at nearly the center of the protruding part 13A of the second plate 13.

The mask holding part 14 has a pedestal 43, which is arranged at the periphery of the first opening 16 of the first member 28, and a chucking pad 44 provided on said pedestal 43. The chucking pad 44 is provided at the upper surface 43T of the pedestal 43. The pedestal 43 and the chucking pad 44 are arranged along two opposing sides from among the four sides of the first opening 16 and have the lengthwise direction in the Y axis direction. The chucking pad 44 has a holding surface 45, which holds at least a part of the lower surface Mb of the mask M.

The holding surface 45 includes at least a part of the upper surface 43T of the pedestal 43. In the present embodiment, the holding surface 45 is nearly parallel to the XY plane. In addition, in the present embodiment, the surface within the concave part 40, which includes said holding surface 45, is a mounting surface 45a on which the mask M is to be mounted. The chucking pad 44 has a groove 46 formed at a part of the upper surface 43T of the pedestal 43 and a suction port 47 formed at the inside of the groove 46. The holding surface 45 includes a portion of the upper surface 43T of the pedestal 43 in which a groove 46 is not formed. The suction port 47 is connected to a pressure regulation apparatus that is not shown via a flow passageway 48a. It is possible to suction the gas of the suction port 47 by controlling said pressure regulation apparatus by means of the control apparatus 3.

The chucking pad 44 performs holding so that at least a part of the lower surface Mb of the mask M is chucked. By the pressure regulation apparatus 48 connected to the suction port 47 operating in a status in which the holding surface 45 of the chucking pad 44 and a part of the lower surface Mb of the mask M have been brought into contact, gas of the space surrounded by the lower surface Mb of the mask M and the inner surface of the groove 46 is suctioned by means of the suction port 47, and that space comes to negative pressure. Through this, the lower surface Mb of the mask M is chuck held by the holding surface 45. The mask stage 1 is able to move while holding the mask M using the holding surface 45. In addition, by means of the suction operation that uses the suction port 47 being stopped, it is possible to remove the mask M from the mask holding part 14.

The mask M has a pattern forming region on which a pattern has been formed at a part of the lower surface Mb thereof, and the chucking pad 44, which includes the holding surface 45, holds regions of the lower surface Mb of said mask M other than the pattern forming region. The mask holding part 14 holds the mask M so that the pattern forming region of the mask M is arranged at the first opening 16.

The second member 29 has the reflecting surface 1R to which the measurement light LB of the laser interferometer 19A is irradiated at the side surface of the +X side. The reflecting surface 1R of the second member 29 is nearly perpendicular to the X axis. A transmission region 18X that the measurement light LB of the laser interferometer 19A is able to pass through is arranged at the side surface of the +X side of the counter mass 18. The laser interferometer 19A is able to irradiate the measurement light LB to the reflecting surface 1R of the second member 29 via the transmission region 18X.

The mask stage drive apparatus 15 is able to move the mask stage 1. The mask stage drive apparatus 15 has a first drive apparatus 30, which is able to move the mask stage 1 in the Y axis direction and the θZ direction, and a second drive apparatus 31, which is able to move the mask stage 1 in the X axis direction. In the present embodiment, the first drive apparatus 30 includes a pair of linear motors 32, 33. The second drive apparatus 31 includes a voice coil motor 36.

The first drive apparatus 30 comprises a pair of guide members 34, 35 that are long along the Y axis direction (movement direction). The guide members 34, 35 are arranged at the inside of the counter mass 18. Guide member 34 is arranged at the +X side of the first member 28, and guide member 35 is arranged at the −X side of the first member 28. Therefore, these guide members 34, 35 are provided at positions that are separated with respect to the X axis direction. The +Y side end and the −Y side end of guide members 34 and 35 are fixed to the inner surface of the counter mass 18 via a prescribed fixing member. Guide members 34 and 35 movably support the mask stage main body 27 in the Y axis direction.

These guide members 34, 35 respectively have coil units 51 that function as the stators of linear motors 32 and 33. The first drive member 28 of the mask stage 1 has magnet units 55 that function as the movers of linear motors 32 and 33. The magnet units 55 are arranged at the +X side end face and the −X side end face of the first member 28 and are arranged at the +X side and the −X side respectively so as to correspond to the coil units 51 of guide members 34 and 35.

In the present embodiment, a moving magnet system linear motor 32, which is able to move the mask stage main body 27 in the Y axis direction, is formed by means of a mover provided at the +X side end of the first member 28 and a stator provided at guide member 34. Similarly, a moving magnet system linear motor 33, which is able to move the mask stage main body 27 in the Y axis direction, is formed by means of a mover provided at the −X side end of the first member 28 and a stator provided at guide member 35.

The second drive apparatus 31 comprises a guide member 37 that is long in the Y axis direction. Guide member 37 has a coil unit that functions as a stator of the voice coil motor 36. Guide member 37 is arranged at the inside of the counter mass 18. Guide member 37 is arranged at the −X side of guide member 35. The +Y side end and the −Y side end of the guide member 37 are secured to the inner surface of the counter mass 18 via a prescribed fixing member.

A magnet unit that functions as the mover of the voice coil motor 36 is arranged at the −X side end of the mask stage main body 27. A moving magnet system voice coil motor 36, which is able to move the mask stage main body 27 in the X axis direction, is formed by means of a mover provider at the −X side end of the mask stage main body 27 and a stator provided at guide member 37.

The mask stage 1 is able to move in three directions, which are the X axis, Y axis and θZ directions, by means of a mask stage drive apparatus 15 that includes first and second drive apparatuses 30, 31. The mask stage main body 27 holds the mask M on the mask holding part 14 and is able to move along the XY plane, which includes the irradiation position of the exposure light EL (the illumination region of the illumination light IL).

The counter mass 18 is a rectangular frame-shaped member that has an opening in which it is possible to arrange the mask stage 1, and it is able to move on the upper surface of the second plate 13 in order to offset the reaction force accompanying movement of the mask stage 1. The counter mass 18 offsets the reaction force accompanying movement of the mask stage 1 by moving in a direction opposite the movement direction of the mask stage 1.

In addition, as shown in FIG. 1, in the present embodiment, a focus leveling detection system 70 is provided. Surface position information of the surface of the mask M (position information relating to the Z axis, θX and θY directions) is detected by said focus leveling detection system 70. The focus leveling detection system 70 has a projecting system 70a, which projects detection light Lb to the illumination region IR of the exposure light EL of the mask M held by the mask holding part 14, and a light receiving system 70b, which is able to receive the detection light Lb that has passed through the mask M. The projecting system 70*a* projects detection light Lb to the surface of the mask M from a diagonal direction. The light receiving system 70*b* receives the detection light Lb that has been projected to the surface of the mask M by the projecting system 70*a* and reflected by that surface. The light receiving system 70*b* is connected to the control apparatus 3 and is such that signals based on said received light are supplied to the control apparatus 3 from the light receiving system 70*b* as information relating to changes in the shape of the mounting surface.

In the present embodiment, the work piece P is for manufacturing a device and, for example, includes those in which a photosensitive film is formed on a base material such as a semiconductor wafer such as a silicon wafer. The photosensitive film is a photosensitive material (photoresist) film. In addition, in the work piece P, various films such as protective films (topcoat films) may be formed on top of the photosensitive film.

Figure 4A:
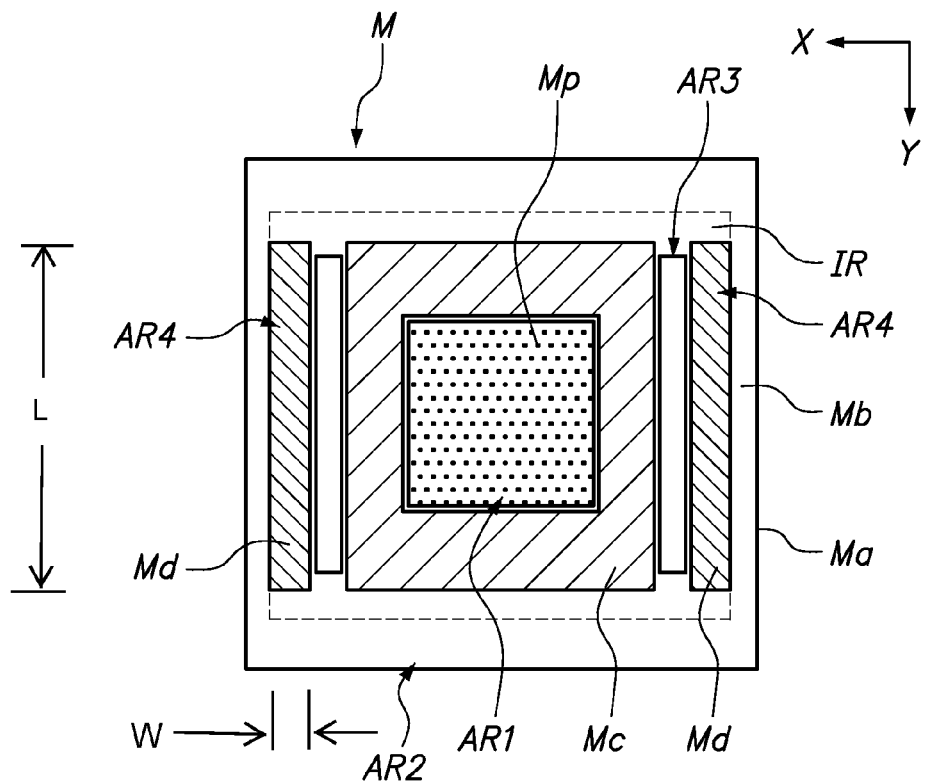
FIGS. 4A and 4B are drawings that show the shape of a mask relating to the present embodiment.
Figure 4B:
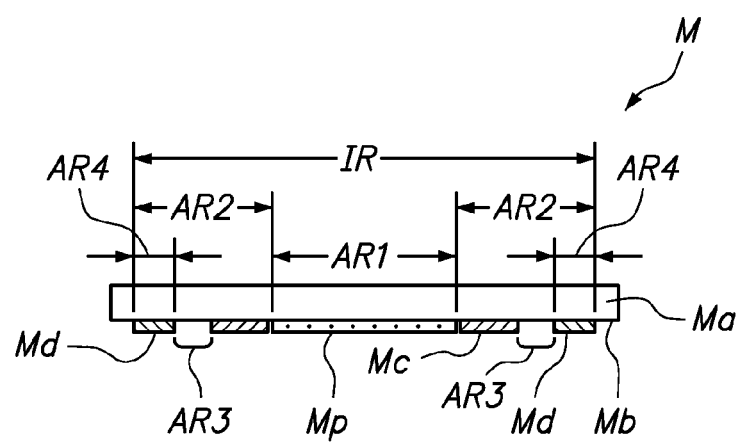

The mask M (also sometimes referred to as a reticle) includes a device pattern to be projected onto the work piece P. FIGS. 4A and 4B are drawings that show one configuration of the mask M. FIG. 4A is a plan view of the mask M, and FIG. 4B is a side surface view of the mask M. In FIG. 4A, the lower surface side of FIG. 1 is shown with respect to the mask M. As shown in FIG. 4A and FIG. 4B, the mask M is a transmission type mask on which a prescribed pattern Mp is formed on the lower surface Mb of a transparent plate Ma such as a glass plate using a light shielding film such as chrome.

The mask M, as shown in FIG. 4A, has a pattern forming region (prescribed region) AR1 and an outer circumference region AR2 in a plan view. The pattern forming region AR1 is a region of the mask M in which a pattern Mp is formed. The pattern forming region AR1 is demarcated in a rectangular shape at the center part of the mask M in a plan view. The outer circumference region AR2 is a region outside the pattern forming region AR1.

The outer circumference region AR2 has a holding region AR3 and a light absorbing region AR4. The holding region AR3 is the region that is held by the mask holding part 14. The holding region AR3 is a band-shaped region that has its length in the Y axis direction and is provided at two locations in the X axis direction. The light absorbing region AR4 is a band-shaped region in a plan view that has its length L in the Y axis direction and its width W in the X axis direction. Further, for each light absorbing region AR4 in FIG. 4A, the length is greater than the width. In one embodiment, a total of two light absorbing regions AR4 are provided, with, for example, one at the −X side (a first side) of the holding region AR3 arranged at the −X side in FIG. 4A and the other at the +X side (a second side) of the holding region AR3 arranged at the +X side. Specifically, the light absorbing region AR4 is arranged at the outer circumference side of the mask M with respect to the holding region AR3.

The light absorbing region AR4 is a region in which the absorption ratio of the exposure light is higher than that of other portions of the mask M. A light absorbing member Md is provided in the light absorbing region AR4. The light absorbing member Md, as shown in FIG. 4A, is a thin film formed in a band shape in a plan view. The light absorbing member Md, as shown in FIG. 4B, is formed at the same layer as the pattern Mp, that is, at the lower surface Mb of the transparent plate Ma. An example of the material that comprises the light absorbing member Md is chrome oxide (CrO), for example. The exposure light with which the light absorbing region AR4 has been illuminated is absorbed by said light absorbing member Md and is converted into heat energy to generate heat.

The shape of the light absorbing region AR4 in a plan view is not limited to a band shape and may also be another shape such as an elliptical shape. In addition, it is not limited to a shape that is connected in the Y axis direction, and the configuration may also be such that, for example, it is arrayed by being separated in the Y axis direction in a plan view. Moreover, it is not limited to a configuration formed in a linear shape in the Y axis direction and may also be, for example, a configuration that is curved toward the +X side or the −X side, and it may also be a shape (for example, a wave shape) that protrudes to the +X side and the −X side respectively. Alternatively, the light absorbing member Md can define both the light absorbing region AR4 and the holding region AR3.

In FIG. 4A and FIG. 4B, the illumination region IR of the exposure light is shown. In the present embodiment, the illumination region IR is a rectangular region that is set in a range that includes the two light absorbing regions AR4 of the mask M and, for example, has its length in the X axis direction. Specifically, in the illumination system IL, the dimensions of the opening part 60*a* of the reticle blind 60 are defined so that the illumination region IR is set in the aforementioned region of the mask M. By defining the dimensions of the opening part 60*a* in this way, it is possible to guide exposure light that is identical to the exposure light irradiated to the pattern forming region AR1 of the mask M to the outer circumference side of the holding region AR3. In one embodiment the light shielding region Mc surrounds the pattern area AR1.

A light shielding member Mc is provided between the two holding regions AR3 of the outer circumference region AR2. The light shielding member Mc, as shown in FIG. 4A, is formed in a rectangular ring-shape in a plan view so as to surround the pattern forming region AR1. The light shielding member Mc, as shown in FIG. 4B, is formed at the same layer as the pattern Mp, that is, at the lower surface Mb of the transparent plate Ma. An example of the material that comprises the light shielding member Mc is chrome (Cr). In an alternative embodiment, the light shielding region Mc can be contiguous with the holding regions AR3. In this embodiment, the light shielding region Mc and the holding regions AR3 can be made of the same material or the light shielding region Mc can be more reflective.

Next, an example of operation of an exposure apparatus EX relating to the present embodiment will be described. The control apparatus 3 regulates the environment (including the temperature, humidity and cleanliness) of the vicinity of the exposure apparatus EX. When the mask M is conveyed to the mask holding part 14 in this status, the control apparatus 3 chucks the holding region AR3 of the lower surface Mb of the mask M to the holding surface 45 and holds said mask M on the mounting surface 45*a* (holding process).

After the control apparatus 3 has held the mask M, preparatory work such as mask alignment, baseline measurement, etc. that uses a reticle microscope built into the measurement stage 4 is performed. Then, the work piece P that has been conveyed to the work piece holding part 22 is held, fine alignment (EGA: enhanced global alignment, etc.) of the work piece P using an alignment sensor is performed, and the array coordinates of a plurality of shot regions on the work piece P are obtained. Then, the measurement values of the laser interferometer are monitored based on the alignment results while the linear motor is controlled to move the work piece stage 2 to the scanning start position for exposure of the first shot of the work piece P. The control apparatus 3 starts scanning of the mask stage 1 and the work piece stage 2 in the Y directions and, when both stages have reached their respective target scanning velocities, illuminates the pattern region of the mask M using illumination light for exposure and starts scanning exposure.

The control apparatus 3, at the time of this scanning exposure, synchronously controls the mask stage 1 and the work piece stage 2 so that the movement velocity of the mask stage 1 in the Y axis direction and the movement velocity of the work piece stage 2 in the Y axis direction are maintained at a velocity ratio that corresponds to the projection magnification of the projection optical system PL. Different regions of the pattern region of the mask M are sequentially illuminated using illumination light, and by illumination with respect to the entire surface of the pattern region being completed, scanning exposure of the first shot on the work piece P is completed. Through this, the pattern of the mask M is reduction transferred to the first shot region on the work piece P via the projection optical system PL.

In this way, when scanning exposure of the first shot ends, the control apparatus 3 step moves the work piece stage 2 in the X and Y directions and moves it to the scanning start position for exposure of the second shot. In this step movement, the position of the work piece stage 2 in the X, Y and θZ directions is measured in real time based on the measured value of the laser interferometer 19, which detects the position of said work piece stage 2 (position of the work piece P). The position of the work piece stage 2 is controlled based on this measurement result. Then, the control apparatus 3 performs scanning exposure with respect to the second shot region in the same way as with the first shot region above. Through said control, scanning exposure of the shot regions on the work piece P and step movement for the next shot exposure are repeatedly performed, and the pattern of the mask M is sequentially transferred to exposure target shot regions on the work piece P.

Figure 5A:
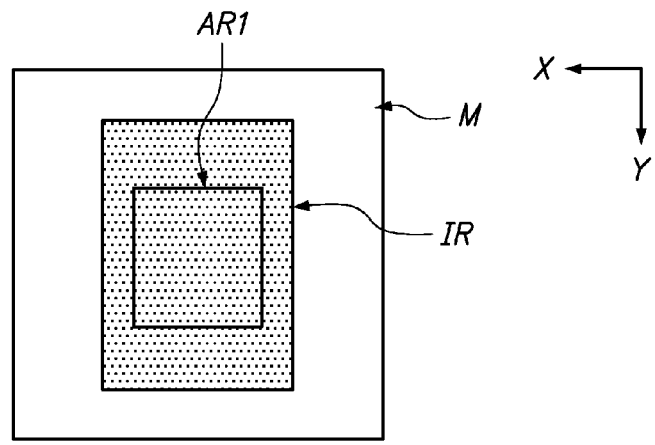
FIGS. 5A-5C are drawing that show the condition of mask thermal expansion.
Figure 5B:
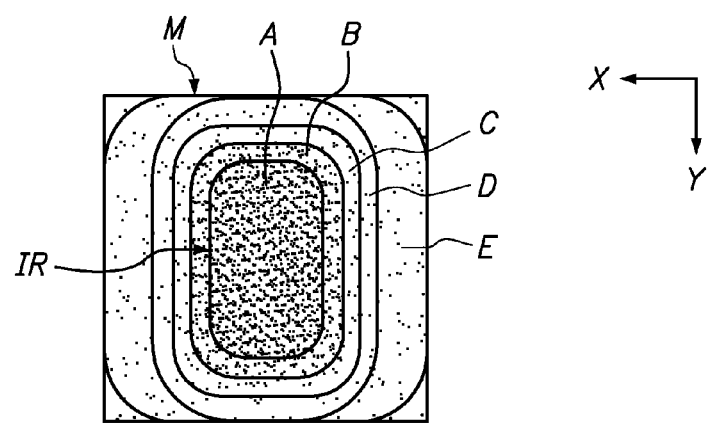

In general, in the case in which exposure light is illuminated to the mask M, for example, as shown in FIG. 5A, the range of the illumination region IR is set to a range along the pattern forming region AR1. In this case, the temperature of the illumination region IR of the mask M, which receives irradiation of the exposure light, rises as the number of irradiations of the exposure light multiply. As shown in FIG. 5B, the temperature distribution at this time is such that the illumination region IR of the mask M has the highest temperature and becomes lower in temperature the more it reaches the outer circumference part of the mask M. In FIG. 5B, five areas of the mask M have been labeled A-E. In this embodiment, illumination of the pattern forming region AR1 (not labeled in FIG. 5B) mask M causes the area labeled A to become the highest in temperature, with each successive area B, C, D and E becoming lower in temperature. When the temperature of the mask M rises, the mask M deforms due to thermal expansion, and distortion and deformation occurs. When deformation occurs in the shape of the mask M, the pattern projected onto the work piece P via said mask M unfortunately distorts.

Figure 5C:
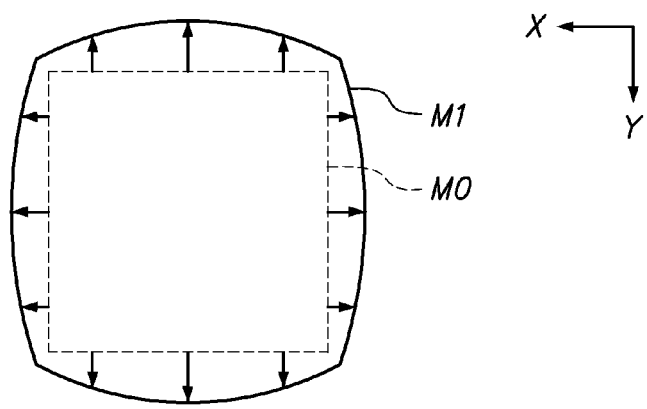

In the case in which the mask M deforms due to thermal expansion, as shown in FIG. 5C, the center parts of the respective sides deform from a rectangular shape M0 to a shape M1 that is curved toward the outer side of the mask M. As for the deformation components at this time, although nonlinear components are included somewhat, the status is such that many linear components are included. In this case, for example, by performing linear correction such as varying the magnification of the projection optical system PL with respect to the pattern to be projected via said mask M, it is possible to easily reduce warping of said pattern.

Figure 6:
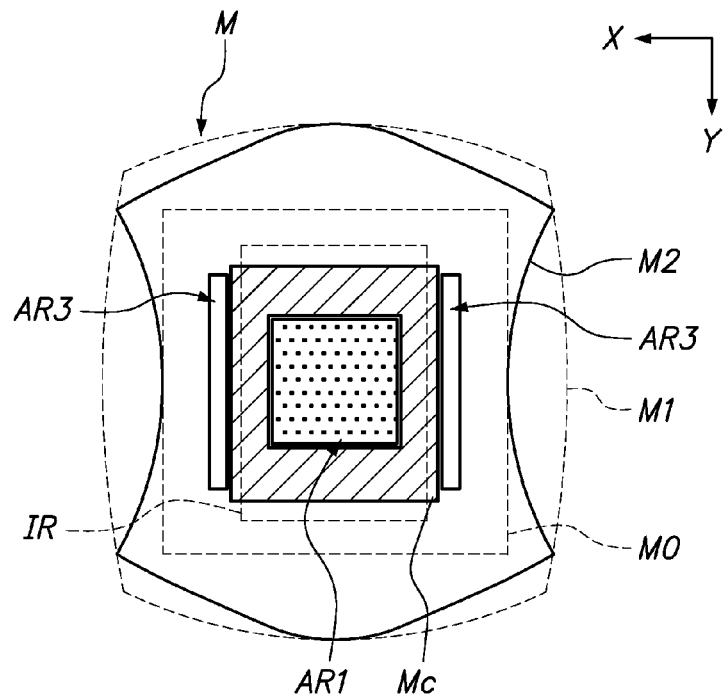
FIG. 6 is a drawing that shows the condition of mask deformation.

In a case such as this, when the mask M is, for example, chucked and held by the mask holding part 14, as shown in FIG. 6, deformation of the mask M in the holding region AR3 is partially restricted. For this reason, the mask M becomes a shape M2 in which the center parts of the respective sides are curved toward the inside of the mask M. The deformation components at this time are in a status such that many nonlinear components are included. Even if linear correction, such as, for example, varying the magnification of the projection optical system PL with respect to the pattern to be projected via the mask M, which includes many nonlinear components and has deformed, were implemented, reducing distortion of said pattern would be difficult. When the pattern is projected onto the work piece P in a distorted status, there is a possibility of exposure effects occurring.

Therefore, in the present embodiment, in one embodiment, a deformation process is performed in which the outer circumference side (one side) of the holding region AR3, which is held by the mask holding part 14 of the mask M held in the above holding process is selectively deformed with respect to other portions (the other side) of the mask M. In said deformation process, the further outer circumference side of the holding region AR3 of the outer circumference region AR2 provided at the periphery of the pattern forming region AR1 of the mask M is selectively deformed with respect to other portions of said outer circumference region AR2 (selective deformation process).

Specifically, in one embodiment, light that has been emitted from an identical light source as the exposure light irradiated to the pattern forming region AR1 is guided so that it is irradiated to the outer circumference side of the holding region AR3, and selective deformation is caused by heating resulting from irradiation of said exposure light (heating process). In the present embodiment, by setting the dimensions of the opening parts 60a of the reticle blind 60, the illumination region IR of the exposure light is set in a range that includes the light absorbing region AR4 of the mask M, and the exposure light is irradiated to the light absorbing member Md provided in said light absorbing region AR4. Alternatively, one or both of the light absorbing regions AR4 can be illuminated by another light source 99 (illustrated as a box in FIG. 1) that generates light (i) at the same wavelength as the exposure light from the illumination system IL, or (ii) at a different wavelength than the exposure light from the illumination system IL.

Figure 7:
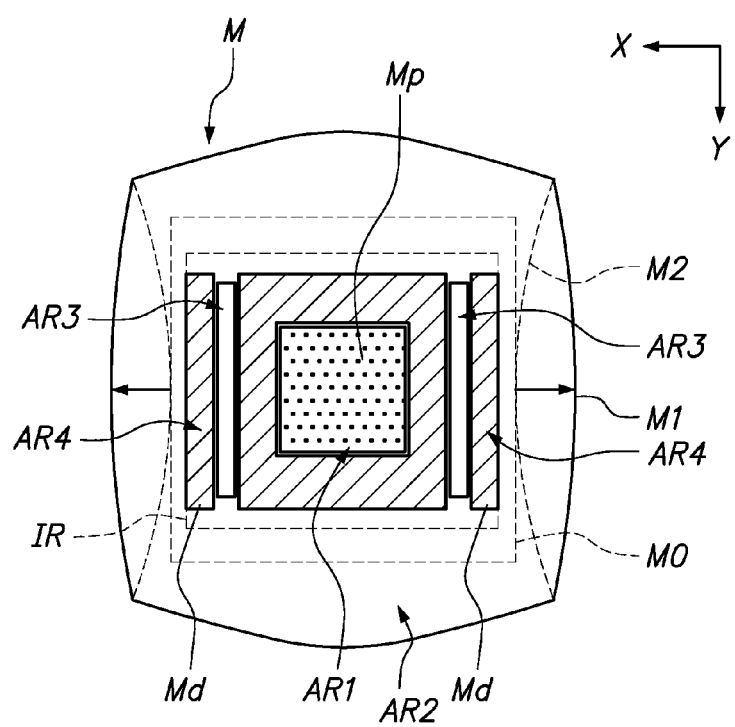
FIG. 7 is a drawing that shows the condition of mask deformation.

When the range of the illumination region IR is set in the manner described above, the exposure light of the respective shot exposures is irradiated to the light absorbing member Md, so the deformation process is performed simultaneously with said shot exposure each time shot exposure is performed. The exposure light irradiated to the light absorbing region AR4 is absorbed by the light absorbing member Md provided in said light absorbing region AR4 and is converted to heat energy. Through said heat energy, as shown in FIG. 7, the center part of the Y direction of the outer circumference side with respect to the holding region AR3 of the mask M thermally expands toward the outer side of the mask M. Through this thermal expansion, the nonlinear components included in the deformation components of the mask M are removed, and the aforementioned shape M1 that includes many linear components results. In this case, by the control apparatus 3 performing corrections such as, for example, varying the magnification of the projection optical system PL, distortion of the pattern projected via the mask M is corrected.

In this way, through the present embodiment, in certain embodiments, the holding region AR3 of the mask M is held at the mask holding part 14, guiding is performed so that light that is emitted from a light source that is identical to that of the exposure light irradiated to the pattern forming region AR1 is irradiated to the light absorbing regions AR4 on the outer circumference side of the holding region AR3, and, by means of the heating resulting from irradiation of said exposure light, the outer circumference side of the holding region AR3 of the mask M is selectively deformed, so it is possible to reduce and minimize the nonlinear deformation components of said mask M attributable to holding of the mask M. Since it is possible to put the pattern of the exposure light projected via the mask M into a more linearly correctable status, it is possible to reduce distortion of the pattern of said exposure light. Through this, it is possible to reduce exposure defects.

Next, a second embodiment of the present invention will be described. Similarly to the first embodiment, in the drawings used in the description below, the dimensions have been appropriately changed in order to make the respective members recognizable sizes. In addition, constituent elements that are identical to those of the first embodiment are assigned the same symbols, and descriptions thereof have been omitted.

In the present embodiment, the mode of the deformation process differs from that of the first embodiment, so a description will be given focusing on said points of difference. In the deformation process of the present embodiment, a deformation force is caused to act on the outer circumference side (one side) of the holding region AR3 of the mask M (action process). Said action process is such that a deformation force is caused to act on the mask M by deforming the mask stage 1 in a status in which the mask M is held by means of the mask holding part 14 provided on the first member 28 of the mask stage 1, for example.

Figure 8:
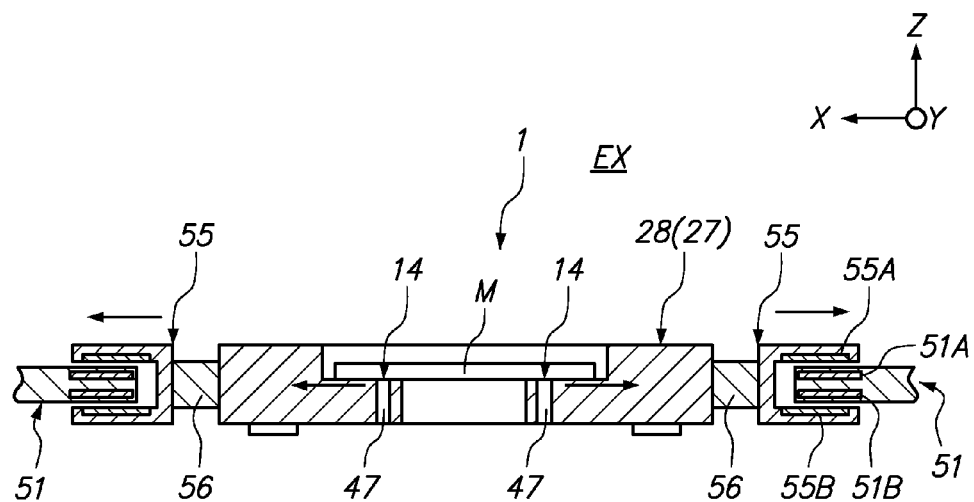
FIG. 8 is a drawing that shows the configuration of a part of an exposure apparatus relating to another embodiment of the present invention.

FIG. 8 is a drawing that shows the configuration of a part of the mask stage 1 of the exposure apparatus EX relating to the present embodiment. As shown in this drawing, the coil unit 51 has coils (51A, 51B) respectively arranged at the upper surface and the lower surface of the Z axis direction. Said coils 51A, 51B are such that the U phase, the V phase and the W phase are repeatedly arrayed along the Y axis direction respectively. Coil 51A and coil 51B are provided at positions that are superposed in a plan view, and it is possible to cause electric currents to respectively independently flow to these. Therefore, at coil 51A and coil 51B, it is possible to cause electric currents to flow in the same direction, and it is also possible to cause electric currents to flow in different directions.

A magnet unit 55 has magnets (55A, 55B) of which two each are arranged in the Z axis direction at the +X side and the −X side respectively so as to correspond to the two coil units 51 of the guide members 34, 35. Magnets 55A oppose the coil 51A of the coil unit 51, and magnets 55B oppose the coil 51B of the coil unit.

In the deformation process of the present embodiment, it is possible to deform the mask stage 1 configured in the above way by adjusting the directions of the electric currents that flow to coil 51A and coil 51B. Specifically, a force is produced in the direction in which the mask stage 1 is moved to the +X side between the +X side coil unit 51 and magnet unit 55 in the drawing. In addition, a force is produced in the direction in which the mask stage 1 is moved to the −X side between the −X side coil unit 51 and magnet unit 55 in the figure. Through this, the first member 28 of the mask stage 1 is pulled by said force and deforms so as to widen in the X axis directions. In conjunction with said deformation, with regard to the mask holding part 14 provided on the first member 28, the mask holding part 14 of the +X side in the drawing moves to the +X side, and the mask holding part 14 of the −X side in the drawing moves to the −X side. For this reason, the interval among mask holding parts 14 also widens in the X axis directions.

Figure 9:
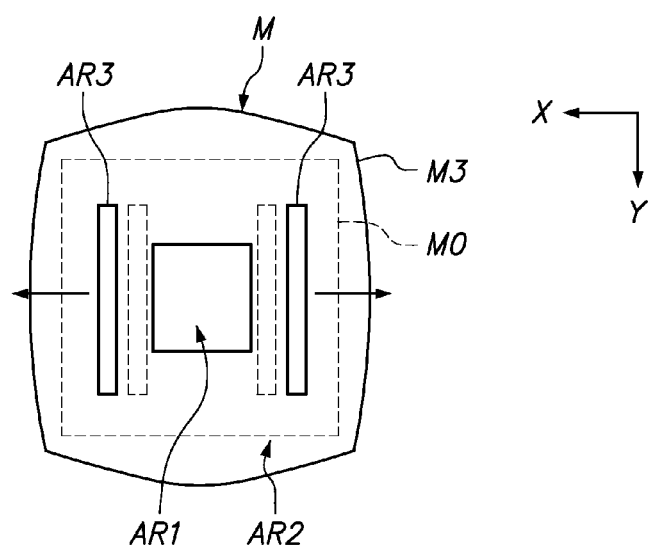
FIG. 9 is a drawing that shows the condition of deformation of the mask relating to the present embodiment.

FIG. 9 is a plan view that shows the condition of the mask M in the deformation process. As shown in FIG. 9, the interval of the mask holding parts 14 widens in the X axis directions in a status in which the mask M is held, and pulling force in the X axis directions is applied to the mask M. This force is a deformation force that deforms the mask M. The mask M deforms so as to widen in the X axis directions by means of said deformation force, and the outer circumference side on the X axis direction of the holding region AR3 curves toward the outer side of the mask M. By causing the outer side of the holding region AR3 to curve in this way, the nonlinear deformation components of the mask M are removed. Then, in the same way as in the first embodiment, the control apparatus 3 corrects distortion of the pattern projected via the mask M by the control apparatus performing corrections such as varying the magnification of the projection optical system PL, for example.

In this way, according to the present embodiment, the holding region AR3 of the mask M is held at the mask holding part 14, and by causing a deformation force to act on the outer circumference side of the holding region AR3 of the mask M, the outer circumference side of the holding region AR3 is selectively deformed with respect to the other portions, so it is possible to reduce nonlinear deformation components of the mask M attributable to holding of said mask M. Since it is possible to put the pattern of the exposure light projected via the mask M into a linearly correctable status, it is possible to reduce distortion of said pattern of the exposure light. Through this, it is possible to restrict exposure defects.

Figure 10:
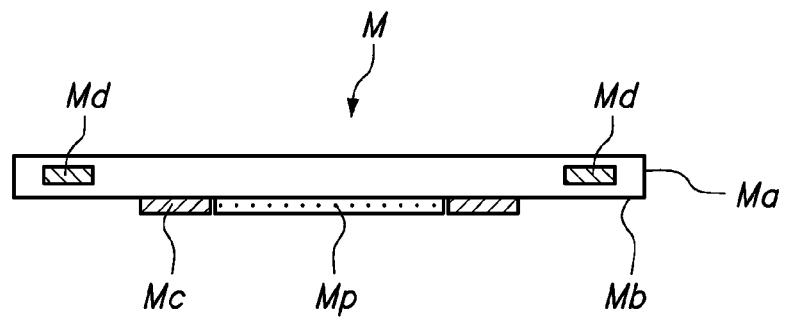
FIG. 10 is a drawing that shows another configuration of a mask relating to the present invention.

The technical scope of the present invention is not limited to the above embodiment, and it is possible to add changes as appropriate within a scope in which there is no deviation from the gist of the present invention. For example, in the above embodiment, a configuration in which the light absorbing member Md was formed at the same layer as the pattern Mp was used, but it is not limited to this, and, as shown in FIG. 10, it may also be a configuration in which the light absorbing member Md is formed at the interior of the transparent plate Ma.

Figure 11:
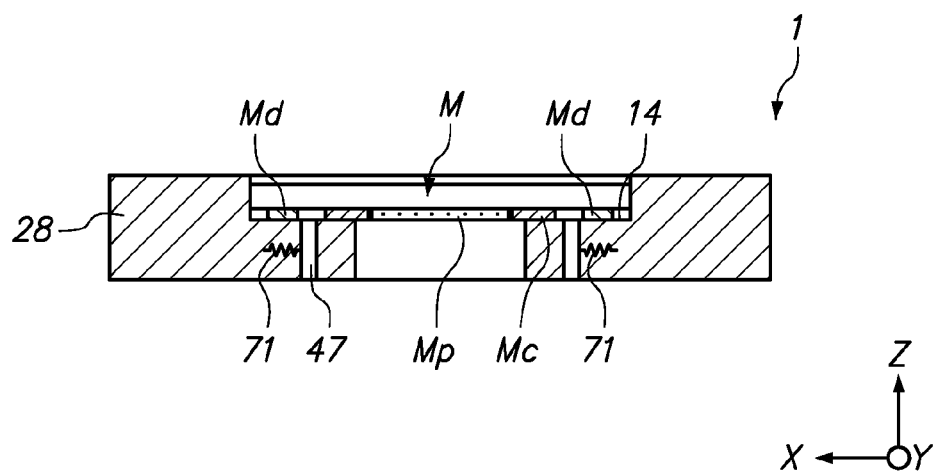
FIG. 11 is a drawing that shows another configuration of a holding member relating to the present invention.

In addition, in the above embodiment, a configuration in which the light absorbing region AR4 was heated by irradiating exposure light to the light absorbing member Md as the heating process was used, but it is not limited to this, and, for example, as shown in FIG. 11, the configuration may also be such that the light absorbing region AR4 is heated by a heating apparatus 71 that has a heat source such as, for example, a heating wire. In the configuration of FIG. 11, the status is such that the heating apparatus 71 is provided, for example, at the interior of the first member 28. It is not limited to this configuration, and the configuration may also be such that the heating apparatus 71 is arranged at the outer side of the first member 28. The heat source is not limited to a heating wire, and it may also be another configuration such as, for example, a configuration that has a flow passageway that causes a heat catalyst to flow.

Figure 12:
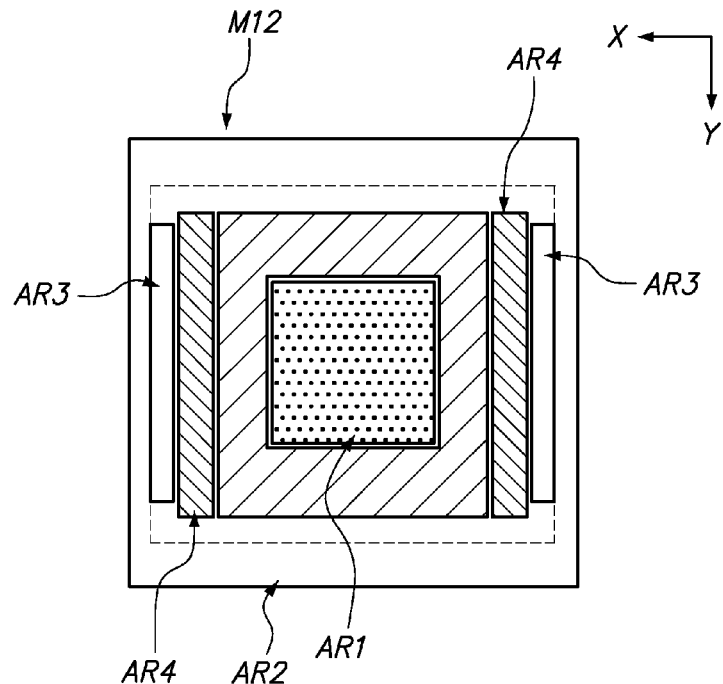
FIG. 12 is a drawing that shows the shape of another embodiment of a mask relating to the present embodiment.

FIG. 12 illustrates another embodiment of the mask M12 (also sometimes referred to as a substrate) that includes a device pattern to be projected onto the work piece P (not shown in FIG. 12). The mask M12 illustrated in FIG. 12 is similar to the mask M illustrated in FIG. 4A. However, in the embodiment illustrated in FIG. 12, the positioning of the holding region AR3 and the light absorbing region AR4 are switched. More specifically, in FIG. 12, (i) the holding region AR3 is positioned closer than the light absorbing region AR4 to the outer circumference region AR2, and (ii) the light absorbing region AR4 is positioned closer than the holding region AR3 to the pattern area AR1. In this embodiment, when the light is directed at the light absorbing region AR4, the light absorbing regions AR4 expand to reduce the distortion of the pattern area AR1.

Note that, in the above embodiments, "one side" is described as the outer circumference side of the holding region AR3. The outer circumference side of the holding region AR3 is, simultaneously with being the outer circumference side of the mask M itself, also the side opposite the pattern forming region AR1 in the case in which the holding region AR3 is used as a reference. Therefore, in the above embodiments, "one side" may also be referred to as the side opposite the pattern forming region AR1 in the case in which the holding region AR3 is used as a reference. When the pattern forming region AR1 of the mask M is deformed, adverse effects are unfortunately exerted upon the pattern of the exposure light projected to the work piece P, and there is a possibility of exposure defects resulting. In contrast with this, by removing the nonlinear components of thermal expansion by deforming the side opposite said pattern forming region AR1, it is possible to reduce adverse effects from being exerted upon the pattern of the exposure light projected to the work piece P, and exposure defects can be avoided as much as possible.

Note that, in the above embodiments, applicable as the exposure apparatus EX are, in addition to step-and-scan system scanning type exposure apparatuses (scanning steppers) that synchronously move the mask M and the substrate P to scan expose the pattern of the mask M, step-and-repeat system projection exposure apparatuses (steppers) that full-field expose the pattern on the mask M in a status in which the mask M and the substrate P have been made stationary and sequentially step move the substrate P.

In addition, in step-and-repeat system exposure, after a reduced image of a first pattern has been transferred onto the work piece P using a projection optical system in a status in which the first pattern and the work piece P have been made substantially stationary, a reduced image of the second pattern may be full-field exposed onto the work piece P so that it is partially superposed with the first pattern using a projection optical system in a status in which the second pattern and the work piece P have been made substantially stationary (stitch system full-field exposure apparatus). In addition, for the stitch system exposure apparatus, application to a step-and-stitch system exposure apparatus that partially superposes and transfers at least two patterns on the work piece P and sequentially moves the work piece P is also possible.

In addition, as disclosed in U.S. Pat. No. 6,611,316 for example, it is also possible to apply the present invention to an exposure apparatus that synthesizes two mask patterns on a work piece via a projection optical system and double exposes, substantially synchronously, one shot region on a work piece by a single scanning exposure. In addition, the present invention is also applicable to a proximity system exposure apparatus, a microprojection analyzer, etc.

In addition, the exposure apparatus EX is also applicable to twin stage type exposure apparatuses that comprise a plurality of work piece stages such as those disclosed in the specification of U.S. Pat. No. 6,341,007, the specification of U.S. Pat. No. 6,400,441, the specification of U.S. Pat. No. 6,549,269, the specification of U.S. Pat. No. 6,590,634, the specification of U.S. Pat. No. 6,208,407, and the specification of U.S. Pat. No. 6,262,796.

In addition, there is also applicability to a liquid immersion exposure apparatus that exposes the substrate via a liquid using exposure light such as that disclosed in, for example, the International Publication No. 99/49504 pamphlet. There is also applicability to EUV light source exposure apparatuses that expose the substrate P using far ultraviolet light.

The types of exposure apparatuses EX are not limited to exposure apparatuses for semiconductor device fabrication that expose a semiconductor device pattern on a work piece P but are also widely applicable to exposure apparatuses for the manufacture of liquid crystal display elements and for the manufacture of displays, and exposure apparatuses for the manufacture of thin film magnetic heads, image pickup elements (CCDs), micromachines, MEMS, DNA chips or reticles or masks.

In addition, in the respective embodiments discussed above, for the light source apparatus that generates ArF excimer laser light as the exposure light EL, it is possible to use an ArF excimer laser, but is also possible to use a high frequency wave generating apparatus that includes a solid state laser light source such as a DFB semiconductor laser or a fiber laser, a light amplification part that has a fiber amp, a wavelength conversion part, etc. and outputs pulsed light with a wavelength of 193 nm such as that disclosed in the specification of U.S. Pat. No. 7,023,610.

In the respective embodiments discussed above, a description was given using an exposure apparatus that comprises a projection optical system PL as an example, but it is possible to apply the present invention to an exposure apparatus and an exposure method that do not use a projection optical system PL. In this way, even in the case in which a projection optical system PL is not used, the exposure light EL is irradiated to the substrate via an optical member such as a lens.

As discussed above, the exposure apparatus EX of the embodiment of the present application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that manufacture of the exposure apparatus be performed in a clean room in which the temperature, the degree of cleanliness, etc. are controlled.

Figure 13:
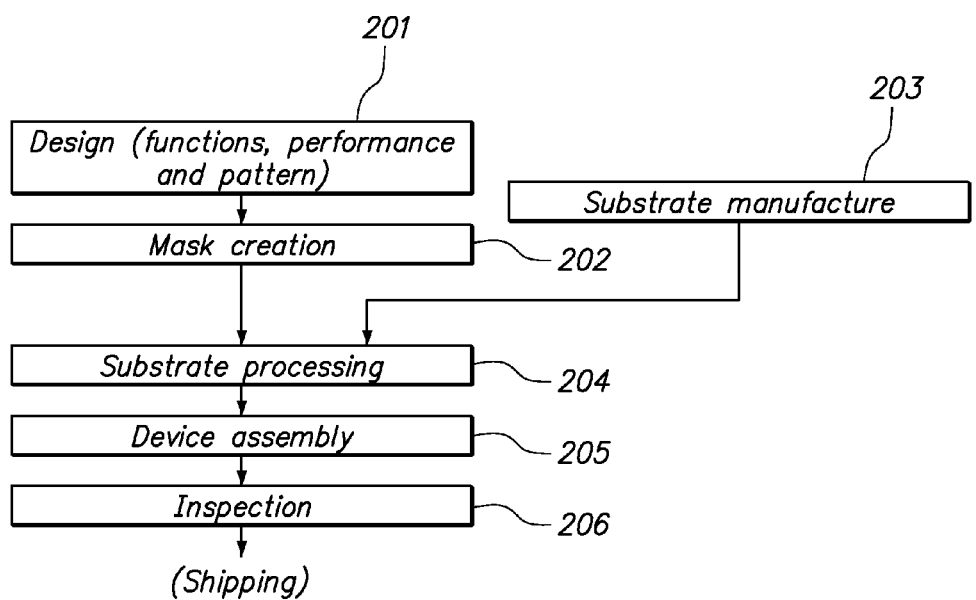
FIG. 13 is a flow chart that shows an example of the manufacturing process of the micro device.

As shown in FIG. 13, micro devices such as semiconductor devices are manufactured by going through a step 201 that performs micro device function and performance design, a step 202 that creates the mask (reticle) based on this design step, a step 203 that manufactures the substrate that is the device base material, a substrate processing step 204 that includes substrate processing (exposure processing) that exposes the substrate via a mask using exposure light according to the embodiments discussed above and develops the exposed substrate, a device assembly step (including processing processes such as the dicing process, bonding process and packaging process) 205, an inspection step 206, etc.

Note that the requirements of the respective embodiments discussed above may be appropriately combined. In addition, the disclosures of all public documents and U.S. patents relating to the exposure apparatuses, etc. that have been cited in the respective embodiments and modification examples discussed above shall be invoked and considered a part of the descriptions of this document.

What is claimed is:

1. An exposure method that transfers a pattern to a work piece, the exposure method comprising:
    providing a mask that includes (i) a pattern forming region in which the pattern is formed that is to be transferred to the work piece, (ii) a light shielding member that surrounds the pattern forming region, and (iii) an outer circumference region that does not include the pattern that is to be transferred to the work piece, the outer circumference region including a first holding region, a first light absorbing region and a second light absorbing region, wherein the first holding region, the first light absorbing region and the second light absorbing region are positioned distal to the light shielding member relative to the pattern forming region, the first light absorbing region and the second light absorbing region being positioned on opposing sides of the light shielding member;
    holding the first holding region of the outer circumference region with a holding part;
    illuminating the pattern forming region of the mask with an exposure light from an illumination system, wherein the illuminating the pattern forming region of the mask with the exposure light causes deformation of the pattern forming region; and
    substantially simultaneously selectively irradiating each of the first light absorbing region and the second light absorbing region of the outer circumference region to selectively heat and deform the outer circumference region of the mask.

2. The exposure method of claim 1 wherein the substantially simultaneously selectively irradiating includes selectively irradiating each of the first light absorbing region and the second light absorbing region to reduce the nonlinear deformation components attributable to the holding of the first holding region.

3. The exposure method of claim 1 wherein the substantially simultaneously selectively irradiating includes selectively irradiating each of the first light absorbing region and the second light absorbing region to reduce warping of the pattern forming region.

4. The exposure method of claim 1 wherein the providing the mask includes each of the first light absorbing region and the second light absorbing region having a higher light absorption ratio than the pattern forming region.

5. The exposure method of claim 1 wherein the providing the mask includes the mask having a second holding region, wherein the first light absorbing region is positioned distal to the first holding region relative to the pattern forming region, and wherein the second light absorbing region is positioned distal to the second holding region relative to the pattern forming region.

6. The exposure method of claim 1 wherein the providing the mask includes each of the first light absorbing region and the second light absorbing region having a higher absorption ratio than the light shielding member.

7. The exposure method of claim 1 wherein the providing the mask includes the outer circumference region having a second holding region that is positioned distal to the light shielding member relative to the pattern forming region, the first holding region and the second holding region being positioned on opposing sides of the light shielding member, the first light absorbing region and the light shielding member being positioned on opposite sides of the first holding region, and the second light absorbing region and the light shielding member being positioned on opposite sides of the second holding region.

8. The exposure method of claim 1 wherein the substantially simultaneously selectively irradiating includes selectively irradiating each of the first light absorbing region and the second light absorbing region with a heat light that is substantially identical to the exposure light.

9. The exposure method of claim 1 wherein the substantially simultaneously selectively irradiating includes selectively irradiating each of the first light absorbing region and the second light absorbing region with a heat light emitted from the illumination system.

10. The exposure method of claim 1 wherein the substantially simultaneously selectively irradiating includes selectively irradiating each of the first light absorbing region and the second light absorbing region with a heat light from a separate heat source.

11. The exposure method of claim 1 wherein the illuminating the pattern forming region includes scanning the pattern forming region in a first axial direction, and wherein the step of providing the mask includes each of the first light absorbing region and the second light absorbing region having a length that extends in a direction substantially parallel to the first axial direction.

12. An exposure method that transfers a pattern to a work piece, the exposure method comprising:
    providing a mask that includes (i) a pattern forming region in which the pattern is formed that is to be transferred to the work piece, and (ii) an outer circumference region that does not include the pattern that is to be transferred to the work piece, the outer circumference region including a first holding region, a second holding region, a first light absorbing area having a first length that extends in a first direction that is parallel to an axis and a first width that extends perpendicular to the axis, and a second light absorbing area having a second length that extends in a second direction that is parallel to the axis and a second width that extend perpendicular to the axis; wherein the first length is greater than the first width and the second length is greater than the second width; wherein the pattern forming region is positioned between the first holding region and the second holding region, and wherein the pattern forming region is positioned between the first light absorbing area and the second light absorbing area;
    holding the first holding region and the second holder region with a holding part;
    scanning the pattern forming region of the mask in a scan direction with an exposure light from an illumination system, wherein the scan direction is parallel to the axis, and wherein illuminating the pattern forming region of the mask with the exposure light causes deformation of the pattern forming region; and
    selectively irradiating the first light absorbing area and the second light absorbing area to selectively heat and deform the outer circumference region.

13. The exposure method of claim 12 wherein the selectively irradiating includes irradiating with a heat light emitted from the illumination system.

14. The exposure method of claim 12 wherein the selectively irradiating includes substantially simultaneously selectively irradiating each of the first light absorbing area and the second light absorbing area to selectively heat and deform the outer circumference region.

15. An exposure method that transfers a pattern to a work piece, the exposure method comprising:
   providing a mask that includes (i) a pattern forming region in which the pattern is formed that is to be transferred to the work piece, and (ii) an outer circumference region that does not include the pattern that is to be transferred to the work piece, the outer circumference region including a first holding region, a second holding region, a first light absorbing area having a first length that extends in a first direction that is parallel to an axis, and a second light absorbing area having a second length that extends in a second direction that is parallel to the axis; wherein the pattern forming region is positioned between the first holding region and the second holding region, and wherein the pattern forming region is positioned between the first light absorbing area and the second light absorbing area;
   holding the first holding region and the second holder region with a holding part;
   scanning the pattern forming region of the mask in a scan direction with an exposure light from an illumination system, wherein the scan direction is parallel to the axis, and wherein illuminating the pattern forming region of the mask with the exposure light causes deformation of the pattern forming region; and
   selectively irradiating the first light absorbing area and the second light absorbing area to selectively heat and deform the outer circumference region, wherein selectively irradiating includes substantially simultaneously selectively irradiating each of the first light absorbing area and the second light absorbing area to selectively heat and deform the outer circumference region.

16. The exposure method of claim 15 wherein the providing the mask includes coupling a first light absorbing member to the first light absorbing area and coupling a second light absorbing member to the second light absorbing area; and wherein each of the light absorbing members has a higher light absorption ratio than the pattern forming region.

17. The exposure method of claim 16 wherein the providing the mask includes the light absorbing areas being positioned distal to the holding regions relative to the pattern forming region, with the first light absorbing area being positioned adjacent to the first holding region, and the second light absorbing area being positioned adjacent to the second holding region.

18. The exposure method of claim 15 wherein the providing the mask includes providing a light shielding member that surrounds the pattern forming region; the first holding region, the second holding region, the first light absorbing area, and the second light absorbing area being positioned distal to the light shielding member relative to the pattern forming region.

19. The exposure method of claim 18 wherein the first light absorbing area and the second light absorbing area are positioned on opposing sides of the light shielding member.

20. The exposure method of claim 18 wherein each of the first light absorbing area and the second light absorbing area has a higher absorption ratio than the light shielding member.

* * * * *